United States Patent [19]

Jo

[11] Patent Number: 5,750,433
[45] Date of Patent: May 12, 1998

[54] METHODS OF FORMING ELECTRICALLY ISOLATED ACTIVE REGION PEDESTALS USING TRENCH-BASED ISOLATION TECHNIQUES

[75] Inventor: Sang-youn Jo, Kyungki-do, Rep. of Korea

[73] Assignee: Samsung Electronics Co., Ltd., Suwon, Rep. of Korea

[21] Appl. No.: 748,865

[22] Filed: Nov. 14, 1996

[30] Foreign Application Priority Data

Jun. 25, 1996 [KR] Rep. of Korea .................... 96-23681

[51] Int. Cl.[6] .................................................. H01L 21/76
[52] U.S. Cl. .......................... 438/424; 438/692; 438/699
[58] Field of Search .................................. 438/424, 427, 438/430, 435, 437, 692, 697, 699, 734, 981, 111, 227, 388, 490

[56] References Cited

U.S. PATENT DOCUMENTS

| | | | |
|---|---|---|---|
| 4,662,064 | 5/1987 | Hsu et al. | |
| 5,006,485 | 4/1991 | Villalon. | |
| 5,139,608 | 8/1992 | Grivna. | |
| 5,212,114 | 5/1993 | Grewal et al. | |
| 5,245,213 | 9/1993 | Huang. | |
| 5,272,115 | 12/1993 | Sato. | |
| 5,292,689 | 3/1994 | Cronin et al. | 437/228 |
| 5,346,584 | 9/1994 | Nasr et al. | 156/636 |
| 5,360,753 | 11/1994 | Park et al. | 437/67 |
| 5,385,861 | 1/1995 | Bashir et al. | 437/67 |
| 5,453,639 | 9/1995 | Cronin et al. | 257/510 |
| 5,466,628 | 11/1995 | Lee et al. | 437/60 |
| 5,492,858 | 2/1996 | Bose et al. | 437/67 |
| 5,494,857 | 2/1996 | Cooperman et al. | 437/228 |
| 5,510,652 | 4/1996 | Burke et al. | 257/752 |
| 5,665,202 | 9/1997 | Subramanian et al. | |

FOREIGN PATENT DOCUMENTS

| | | |
|---|---|---|
| 61-8946 | 1/1986 | Japan. |
| 1-205439 | 8/1989 | Japan. |

OTHER PUBLICATIONS

B. Davari et al., *A New Planarization Technique, Using A Combination of RIE and Chemical Mechanical Polish (CMP)*, IEDM 89, pp. 61-64.

Roh et al., *Highly Manufacturable Shallow Trench Isolation For Giga Bit DRAM*, Extended Abstracts of the 1995 International Conference on Solid State Devices and Materials, Osaka, 1995, pp. 590-592.

*Primary Examiner*—George R. Fourson
*Attorney, Agent, or Firm*—Myers, Bigel, Sibley & Sajovec

[57] ABSTRACT

Methods of forming electrically isolated active regions in semiconductor substrates include the steps of forming a plurality of trenches in a face of a semiconductor substrate to define an active region pedestal between first and second dummy region pedestals and then forming an electrically insulating layer on the active region and dummy region pedestals and in the trenches disposed therebetween. A mask is then patterned to expose a portion of the electrically insulating layer on the active region pedestal and then the exposed portion of the electrically insulating layer is etched so that a thickness of the electrically insulating layer on the active region pedestal is less than a thickness of the electrically insulating layer on the first and second dummy region pedestals. A step is then performed to planarize the electrically insulating layer to selectively expose the active region pedestal but not the first and second dummy region pedestals. This planarizing step also results in the formation of a uniform surface profile at the edges of the active region pedestal.

9 Claims, 3 Drawing Sheets

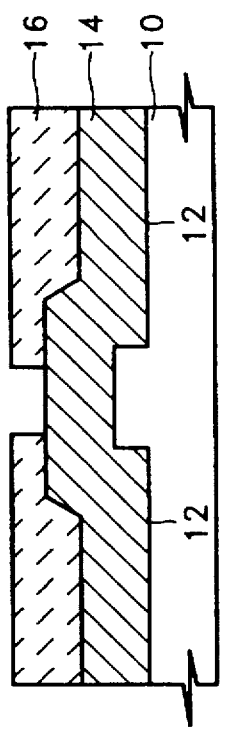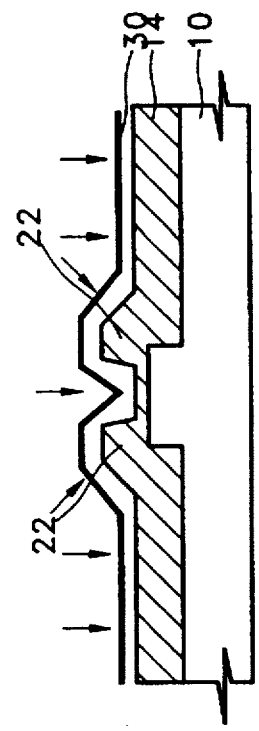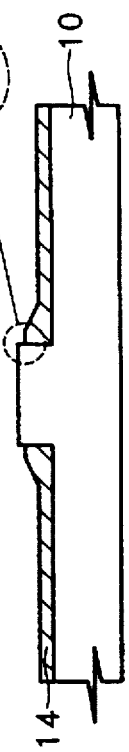
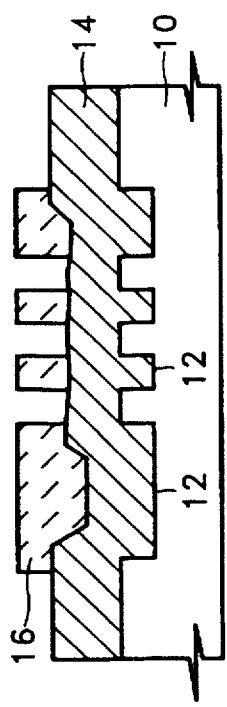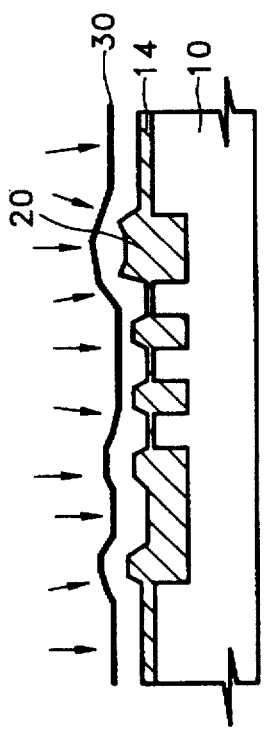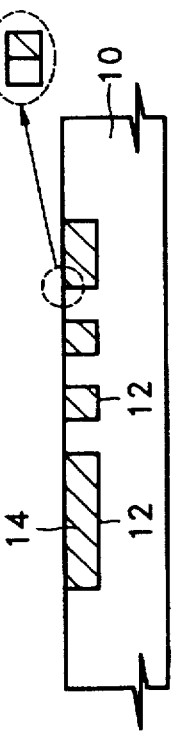
FIG.1A (PRIOR ART) FIG.2A (PRIOR ART) FIG.3A (PRIOR ART)
FIG.1B (PRIOR ART) FIG.2B (PRIOR ART) FIG.3B (PRIOR ART)

METHODS OF FORMING ELECTRICALLY ISOLATED ACTIVE REGION PEDESTALS USING TRENCH-BASED ISOLATION TECHNIQUES

FIELD OF THE INVENTION

The present invention relates to semiconductor devices and fabrication methods, and more particularly to methods of forming electrically isolated semiconductor active regions in a substrate.

BACKGROUND OF THE INVENTION

Device isolation techniques play an important role in the design and performance of highly integrated semiconductor circuits by electrically isolating regions and devices therein from adjacent devices and regions. Such integrated semiconductor circuits included memory devices having arrays of memory cells and peripheral devices for driving the memory cells, for example. Moreover, as the degree of integration in semiconductor circuits increases, there is a concomitant need to develop techniques for forming isolation regions which can be scaled to provide isolation regions having smaller dimensions, but without sacrificing the isolation capability of the regions.

Attempts to improve the isolation capability of field oxide regions in a semiconductor substrate by making these regions narrower to facilitate higher levels of lateral integration, while at the same time thicker to compensate for the decrease in isolation capability caused by the reduction in separation distance between adjacent devices, pose significant drawbacks. In particular, the formation of isolation regions of increased thickness typically causes an increase in the nonuniformity of subsequently formed regions and layers (e.g., metal wiring) which cover both the active regions and inactive isolation regions. Unfortunately, such nonuniformities, which may be characterized by a vertical "step-height" between the face of the semiconductor substrate where an active region(s) is formed and the top surface of the isolation regions, typically cause a reduction in yield as higher and higher levels of integration are attempted.

Attempts to improve the isolation capability of field oxide regions include a conventional isolation method known as local oxidation of silicon (LOCOS). However, this method is typically limited by the formation of lateral bird's beaks when the field oxide isolation regions are being formed. Shallow trench isolation (STI) techniques have also been used to avoid the formation of bird's beak oxide extensions, however such techniques typically require a planarization step which can cause a "dishing" phenomenon, as more fully described in commonly assigned U.S. application Ser. No. 08/675,534 entitled Methods of Forming Combined Trench and Locos-Based Electrical Isolation Regions in Semiconductor Substrates and Isolation Regions Formed Thereby, filed Jul. 3, 1996, the disclosure of which is hereby incorporated herein by reference. To limit the dishing phenomenon, a technique has been proposed to partially etch an oxide layer on a semiconductor active region prior to performing a planarization step. This technique is more fully described in an article by B.H. Roh et al. entitled Highly Manufacturable Trench Isolation for Gigabit DRAMs, 1995 International Conference on Solid State Devices and Materials, Osaka, Japan (1995), pp. 590–592. Other deficiencies of LOCOS and STI isolation techniques are also more fully described in U.S. Pat. Nos. 5,385,861 to Bashir et al., 5,492,858 to Bose et al. and 5,494,857 to Cooperman et al.

Attempts to reduce the occurrence of the dishing phenomenon are also described in an article by B. Davari et al., entitled A New Planarization Technique, Using a Combination of RIE and Chemical Mechanical Polish (CMP), IEDM Technical Digest, pp. 61–64 (1989). In this article, a combination of RIE and CMP steps are performed to improve planarization. In particular, an initial planarization step using RIE is performed prior to a final planarization step using CMP, in order to reduce the degree of dishing present in the resulting structure. Unfortunately, in addition to requiring a separate RIE step, this method may require additional steps such as a step of forming block resist patterns over relatively wide isolation regions, in order to improve the degree of planarization that can be achieved.

FIGS. 1A–1B, 2A–2B and 3A–3B also illustrate a prior art method of forming shallow trench isolation regions. In particular, FIGS. 1A, 2A and 3A illustrate a cell array region of an integrated circuit in which active devices such as memory devices are to be formed and FIGS. 1B, 2B and 3B show a test structure region ("test region") which can be used to indirectly measure process parameters of the devices and structures formed in the cell array region. Referring specifically to FIGS. 1A and 1B, a plurality of trenches 12 are formed in the surface of a semiconductor substrate 10 to define active and test region pedestals. After oxidizing the sidewalls of the trenches 12, the trenches 12 are covered with a field oxide layer 14. To inhibit the dishing phenomenon during planarization, the oxide layer 14 is selectively etched to thin portions of the oxide layer 14 which extend opposite the active and test region pedestals, as illustrated by FIGS. 2A–2B. This selective etching step is performed using a patterned layer of photoresist 16 as an etching mask.

The etching step also results in the formation of oxide pillars 20, as illustrated by FIG. 2A, and an oxide spike 22, as illustrated by FIG. 2B. A planarization step using chemical-mechanical polishing (CMP) is then performed using a soft pad 30. FIGS. 3A and 3B show the result of the planarization step using the soft pad 30. As can be seen by FIG. 3A, because the amount of trench oxide to be removed during the planarization step is relatively small because of the large density of active region pedestals for a given lateral dimension, a planar surface can typically be achieved without the occurrence of the dishing phenomenon. However, because the relative area occupied by the test region pedestal is small as compared to the area occupied by the surrounding wide isolation trenches, the soft pad 30 conforms to the contours of the surface profile of the field oxide in the wide trenches. As a result, the spike 22 is polished away by increased mechanical force. However, because more of the oxide layer 14 is removed from the relatively wide trenches because of the dishing phenomenon, the surface profile at the edges of the test region pedestal is not uniform which means that devices formed in the test region may not accurately reflect the behavior of similar devices formed in the cell array region.

Thus, notwithstanding the above described methods, there continues to be a need for improved methods of forming electrically isolated active regions which are not adversely affected by the occurrence of the dishing phenomenon.

SUMMARY OF THE INVENTION

It is therefore an object of the present invention to provide improved methods of forming electrically isolated active regions in a semiconductor substrate.

It is another object of the present invention to provide methods of forming a plurality of electrically isolated active regions having uniform electrical characteristics across a semiconductor substrate.

It is still another object of the present invention to provide methods of forming electrically isolated active regions which are compatible with chemical-mechanical planarization (CMP) techniques.

These and other objects, features and advantages of the present invention are provided by methods of forming electrically isolated active regions which include the steps of forming a plurality of trenches in a face of a semiconductor substrate to define an active region pedestal between first and second dummy region pedestals and then forming an electrically insulating layer on the active region and dummy region pedestals and in the trenches disposed therebetween. A mask is then patterned to expose a portion of the electrically insulating layer on the active region pedestal and then the exposed portion of the electrically insulating layer is etched so that a thickness of the electrically insulating layer on the active region pedestal is less than a thickness of the electrically insulating layer on the first and second dummy region pedestals. A step is then performed to planarize the electrically insulating layer to selectively expose the active region pedestal but not the first and second dummy region pedestals. This planarizing step also results in the formation of a uniform surface profile at the edges of the active region pedestal. According to a preferred aspect of the present invention, the step of forming an electrically insulating layer comprises the step of forming a layer of tetraethyl-orthosilicate (TEOS) on the active region and first and second dummy region pedestals.

BRIEF DESCRIPTION OF THE DRAWINGS

FIGS. 1A–1B, 2A–2B and 3A–3B illustrate schematic cross-sectional views of intermediate structures illustrating a prior art method of forming electrically isolated active regions in a semiconductor substrate.

DESCRIPTION OF PREFERRED EMBODIMENTS

Figure 4:
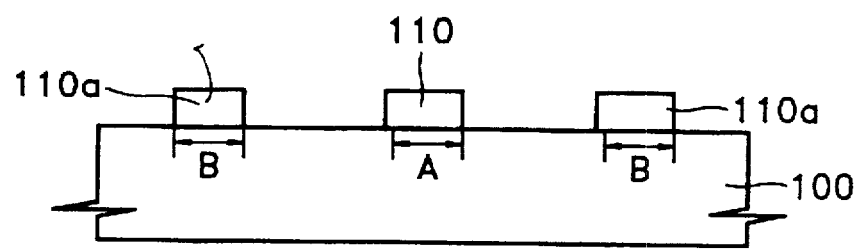
FIGS. 4–8 illustrate schematic cross-sectional views of intermediate structures illustrating a method of forming an electrically isolated active region according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5:
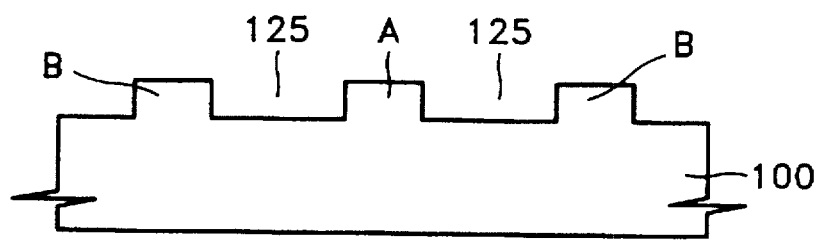

Referring now to FIGS. 4–8, a preferred method of forming an electrically isolated active region will now be described. The active region may be used as a "test" active region located in a peripheral circuit portion of an integrated circuit memory device, for example. In particular, the method includes the step of initially forming a mask on a face of a semiconductor substrate 100, by patterning a layer of silicon nitride ($Si_3N_4$) into regions 110a and 110 to define an active region A and relatively closely spaced dummy active regions B of stripe, rectangular or similar shape on either side of the active region A, as illustrated by FIG. 4. As illustrated by FIG. 5, a plurality of trenches 125 are then formed in the substrate 100 by performing an etching step using the patterned layer of silicon nitride as an etching mask. The mask is then removed to expose the active region pedestal A and dummy region pedestals B.

Figure 6:
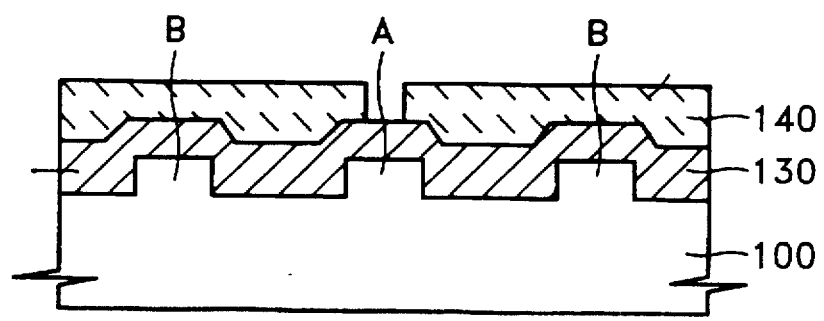
Figure 7:
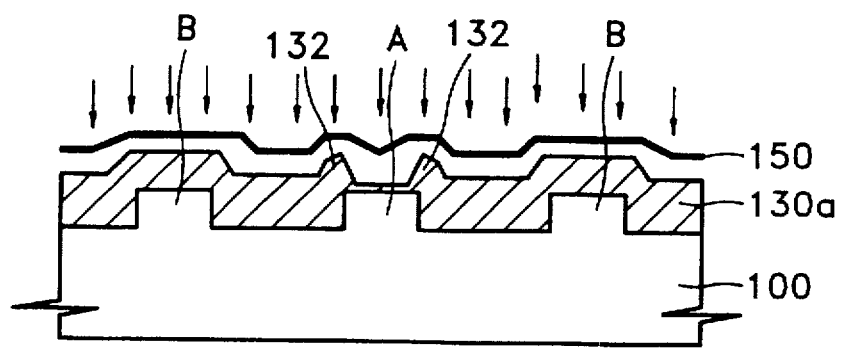

Referring now to FIG. 6, an electrically insulating layer 130, such as a silicon dioxide ($SiO_2$) layer or a layer of tetra-ethyl-ortho-silicate (TEOS) glass having excellent step coverage, is then deposited into the trenches 125 and on the active and dummy region pedestals. Then, a layer 140 of photoresist is deposited and patterned to expose a portion of the electrically insulating layer 130 which extends opposite a top surface of the active region pedestal A. Referring now to FIG. 7, the exposed portion of the electrically insulating layer 130 is then partially etched using the patterned layer 140 of photoresist as a mask. As illustrated, the resulting electrically insulating layer 130a is relatively thin in the region extending opposite the active region pedestal A and relatively thick in the regions extending opposite the dummy region pedestals B. The resulting electrically insulating layer 130a also contains spikes 132 having relatively narrow width which are formed at the boundary between the active region pedestal A and the surrounding trenches 125.

Figure 8:
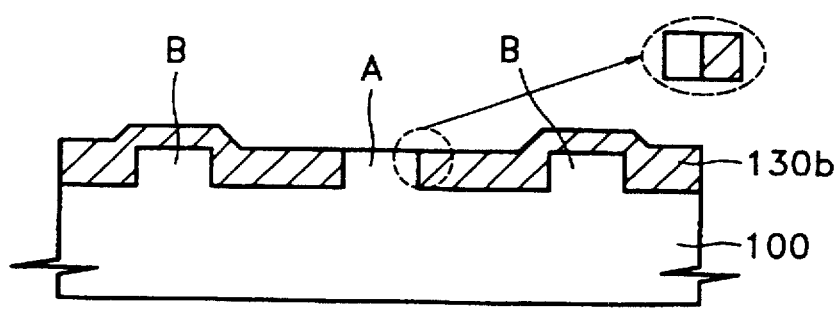

The layer 140 of photoresist is then removed and then a planarization step is performed. Here, the planarization step may comprise a chemical-mechanical polishing (CMP) step using a soft pad 150. During this step, mechanical force is applied to the soft pad 150 in the direction of the arrows so that the soft pad 150 conforms to the surface profile of the resulting electrically insulating region 130a. Referring now to FIG. 8, the planarization step is performed until the top surface of the active region pedestal A is exposed. But, because the electrically insulating region was not removed from the dummy region pedestals B before the planarization step was performed, the dummy region pedestals B are not exposed and the junction between the top edges of the active region pedestal A and the insulating regions in the trenches 125 are formed as coplanar junctions by preventing the dishing phenomenon. For example, the dishing phenomenon is prevented because once the spikes 132 have been removed, the surface profile obtains a generally concave shape which means the top surface of the active region pedestal will be exposed before the surrounding adjacent portions of insulating region 130b are polished below the top surface.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrically isolated active region at a face of a semiconductor substrate, comprising the steps of:

forming a plurality of trenches in a face of a semiconductor substrate to define an active region pedestal between first and second dummy region pedestals;

forming an electrically insulating layer on the active region and dummy region pedestals and in the trenches disposed therebetween;

patterning a mask to expose a portion of the electrically insulating layer on the active region pedestal;

etching the exposed portion of the electrically insulating layer so that a thickness of the electrically insulating layer on the active region pedestal is less than a thickness of the electrically insulating layer on the first and second dummy region pedestals; and planarizing the electrically insulating layer to selectively expose the active region pedestal but not the first and second dummy region pedestals.

2. The method of claim 1, wherein said step of forming an electrically insulating layer comprises forming a layer of tetra-ethyl-ortho-silicate on the active region and first and second dummy region pedestals.

3. The method of claim 1, wherein said planarizing step comprises planarizing the electrically insulating layer using chemical-mechanical polishing.

4. The method of claim 2, wherein said planarizing step comprises planarizing the electrically insulating layer using chemical-mechanical polishing.

5. The method of claim 3, wherein an edge of the active region pedestal and an edge of the first dummy region pedestal is defined by a first trench; and wherein after said planarizing step, a thickness of the electrically insulating layer in the first trench, as measured adjacent a sidewall of first dummy region pedestal is greater than a thickness of the active region pedestal.

6. The method of claim 2, wherein an edge of the active region pedestal and an edge of the first dummy region pedestal is defined by a first trench; and wherein after said planarizing step, a thickness of the electrically insulating layer in the first trench, as measured adjacent a sidewall of first dummy region pedestal is greater than a thickness of the active region pedestal.

7. The method of claim 1, wherein said planarizing step is followed by the step of forming an electronic device in the active region pedestal before removing the electrically insulating layer from the first and second dummy region pedestals.

8. The method of claim 5, wherein said planarizing step is followed by the step of forming an electronic device in the active region pedestal before removing the electrically insulating layer from the first and second dummy region pedestals.

9. The method of claim 6, wherein said planarizing step is followed by the step of forming an electronic device in the active region pedestal before removing the electrically insulating layer from the first and second dummy region pedestals.

* * * * *